(12) United States Patent
Tsutsumi et al.

(10) Patent No.: US 11,196,427 B2
(45) Date of Patent: Dec. 7, 2021

(54) CHARGE PUMP CIRCUIT, PLL CIRCUIT, AND OSCILLATOR

(71) Applicant: Seiko Epson Corporation, Toyko (JP)

(72) Inventors: Akio Tsutsumi, Chino (JP); Ryo Ichikawa, Minowa (JP); Hisahiro Ito, Minowa (JP); Yasunari Furuya, Fujimi (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/186,129

(22) Filed: Feb. 26, 2021

(65) Prior Publication Data

US 2021/0273643 A1    Sep. 2, 2021

(30) Foreign Application Priority Data

Feb. 27, 2020 (JP) .............................. JP2020-031348

(51) Int. Cl.
*H03L 7/089* (2006.01)
*H03L 7/099* (2006.01)
*H03L 7/093* (2006.01)

(52) U.S. Cl.
CPC ............ *H03L 7/0893* (2013.01); *H03L 7/093* (2013.01); *H03L 7/099* (2013.01)

(58) Field of Classification Search
CPC ........ H03L 7/0893; H03L 7/093; H03L 7/099
See application file for complete search history.

(56) References Cited

U.S. PATENT DOCUMENTS

| | | | |
|---|---|---|---|
| 6,320,435 B1 | 11/2001 | Tanimoto | |
| 9,182,295 B1* | 11/2015 | Perrott | H03B 5/04 |
| 9,705,512 B1* | 7/2017 | Kuan | H03L 7/093 |
| 10,063,143 B1* | 8/2018 | Fan | H01F 41/04 |
| 2004/0124938 A1* | 7/2004 | Nilsson | H03C 3/0925 332/112 |
| 2005/0017776 A1* | 1/2005 | Keaveney | H03L 7/0896 327/157 |
| 2005/0206464 A1* | 9/2005 | McCorquodale | H03L 1/02 331/107 A |

(Continued)

FOREIGN PATENT DOCUMENTS

| | | |
|---|---|---|
| JP | S62-023620 A | 1/1987 |
| JP | 2000-036742 A | 2/2000 |

(Continued)

*Primary Examiner* — Adam D Houston
(74) *Attorney, Agent, or Firm* — Harness, Dickey & Pierce, P.L.C.

(57) ABSTRACT

There is configured a charge pump circuit for outputting a phase difference current to a first node, the charge pump circuit including a first current source coupled between a high potential power supply node and the first node, a second current source coupled between a low potential power supply node and the first node, a first switch coupled between the first current source and the first node, a second switch coupled between the second current source and the first node, a third switch coupled between the first current source and a second node, a fourth switch coupled between the second current source and the second node, a third current source for supplying a negative offset current to the first node, and a push-type differential amplifier circuit an input side of which is coupled to the first node, and an output side of which is coupled to the second node.

12 Claims, 11 Drawing Sheets

(56) References Cited

U.S. PATENT DOCUMENTS

| | | | | |
|---|---|---|---|---|
| 2005/0253649 | A1* | 11/2005 | Morishima | H03F 3/38 |
| | | | | 330/10 |
| 2007/0114951 | A1* | 5/2007 | Tsen | H05B 45/46 |
| | | | | 315/291 |
| 2007/0146050 | A1* | 6/2007 | Chen | H02M 3/07 |
| | | | | 327/536 |
| 2007/0146051 | A1* | 6/2007 | Tsen | H02M 3/07 |
| | | | | 327/536 |
| 2009/0016106 | A1* | 1/2009 | Tran | G11C 16/28 |
| | | | | 365/185.05 |
| 2012/0274370 | A1* | 11/2012 | Fortier | H03L 7/099 |
| | | | | 327/156 |
| 2013/0027102 | A1* | 1/2013 | Chen | H03L 7/081 |
| | | | | 327/158 |
| 2013/0300477 | A1* | 11/2013 | Ueda | H04L 7/0337 |
| | | | | 327/159 |
| 2015/0340946 | A1 | 11/2015 | Toshiyuki | |
| 2019/0267942 | A1* | 8/2019 | Kozaki | H03B 5/04 |
| 2020/0321944 | A1* | 10/2020 | Nomura | H03K 3/012 |
| 2020/0389175 | A1* | 12/2020 | Gupta | H03L 7/0992 |

FOREIGN PATENT DOCUMENTS

| | | |
|---|---|---|
| JP | 2000-286700 A | 10/2000 |
| JP | 2001-119296 A | 4/2001 |
| JP | 2011-130518 A | 6/2011 |
| JP | 2015-222926 A | 12/2015 |

* cited by examiner

CHARGE PUMP CIRCUIT, PLL CIRCUIT, AND OSCILLATOR

The present application is based on, and claims priority from JP Application Serial Number 2020-031348, filed Feb. 27, 2020, the disclosure of which is hereby incorporated by reference herein in its entirety.

BACKGROUND

1. Technical Field

The present disclosure relates to a charge pump circuit, a PLL circuit, and an oscillator.

2. Related Art

In the past, there has been known a charge pump circuit which changes a state with a switch so that a current can be drawn from a lowpass filter in the posterior stage or can be supplied to the lowpass filter in accordance with a phase difference between a reference signal and a feedback signal. In order to reduce a current error caused when switching between drawing of a current and supply of a current described above, there is used an operational amplifier circuit. For example, in JP-A-2011-130518, there is disclosed a circuit in which a voltage follower is inserted between a terminal coupled to the lowpass filter and a terminal not coupled thereto to thereby reduce the current error in switching between drawing and supply of the current.

In the related art, it is necessary to flow or draw the same current as that of the current sources (I1, I2) with the voltage follower circuit. Therefore, a degree of freedom in selecting the power consumption by a design is low.

SUMMARY

A charge pump circuit configured to solve the problem described above is a charge pump circuit configured to output a phase difference current to a first node, and including a first current source coupled between a high potential power supply node and the first node, a second current source coupled between a low potential power supply node and the first node, a first switch coupled between the first current source and the first node, a second switch coupled between the second current source and the first node, a third switch coupled between the first current source and the second node, a fourth switch coupled between the second current source and the second node, a third current source configured to supply a negative offset current to the first node, and a push-type differential amplifier circuit an input side of which is coupled to the first node, and an output side of which is coupled to the second node.

Further, there may be configured a PLL circuit including a phase comparator configured to compare a phase of a reference signal and a phase of a feedback signal with each other to output one of a phase-lag control signal and a phase-lead control signal as a phase difference signal, the charge pump circuit described above configured to convert the phase difference signal into the phase difference current, a lowpass filter configured to convert the phase difference current output by the charge pump circuit into a smoothed voltage, a voltage-controlled oscillation circuit configured to output an output signal which changes in frequency in accordance with a control voltage taking the voltage output by the lowpass filter as the control voltage, and a divider circuit which is disposed on a signal path reaching an input of the phase comparator from an output of the voltage-controlled oscillation circuit, and which is configured to output the feedback signal.

Further, there may be configured an oscillator including the PLL circuit and an oscillation circuit configured to oscillate a resonator to supply the PLL circuit with the reference signal.

DESCRIPTION OF EXEMPLARY EMBODIMENTS

Here, an embodiment of the present disclosure will be described in the following order.
(1) Configuration of Oscillator:
　(1-1) Configuration of Fractional-N PLL Circuit:
　(1-2) Configuration of Charge Pump Circuit:
　(1-3) Specific Example of Push-Type Differential Amplifier Circuit:
　(1-4) Modified Examples:
(2) Second Embodiment:
(3) Other Embodiments:

(1) Configuration of Oscillator

Figure 1:
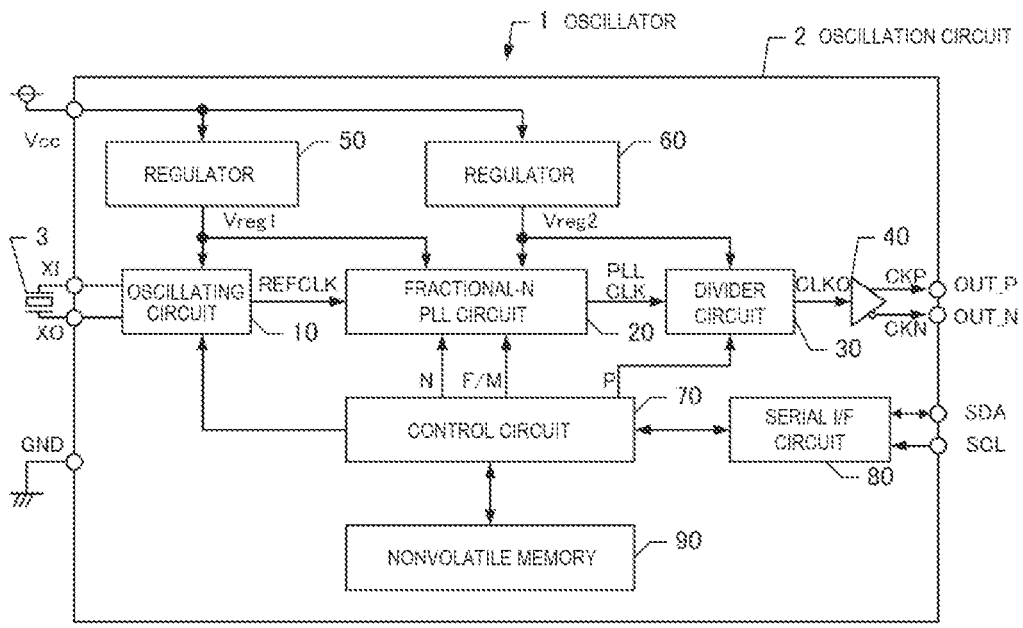
FIG. 1 is a configuration diagram of an oscillator according to an embodiment of the present disclosure.

FIG. 1 is a configuration diagram of an oscillator according to an embodiment of the present disclosure. The oscillator 1 is an oscillator including an oscillation circuit 2 and a resonator 3, and the oscillation circuit 2 and the resonator 3 are housed in a package not shown. In the present embodiment, the resonator 3 is a quartz crystal resonator using quartz crystal as a substrate material, and there is used, for example, an AT-cut crystal resonator or an SC-cut crystal resonator. The resonator 3 can be an SAW (Surface Acoustic Wave) resonator or an MEMS (Micro Electro Mechanical Systems) resonator. Further, as the substrate material of the resonator 3, there can be used a piezoelectric single crystal of lithium tantalate, lithium niobate, or the like, a piezoelectric material such as piezoelectric ceramics including lead zirconate titanate, or a silicon semiconductor material besides the quartz crystal. As an excitation device of the resonator 3, there can be used a device using a piezoelectric effect, or electrostatic drive using a coulomb force.

The oscillation circuit 2 is provided with a Vcc terminal as a power supply terminal, a GND terminal as a ground terminal, an OUT_P terminal and an OUT_N terminal as differential output terminals, an SDA terminal and an SCL terminal used for an external interface, and an XI terminal and an XO terminal as coupling terminals to the resonator 3. The Vcc terminal, the GND terminal, the OUT_P terminal, the OUT_N terminal, the SDA terminal, and the SCL terminal are also coupled to external terminals (not shown) of the oscillator 1.

In the present embodiment, the oscillation circuit 2 is configured including an oscillating circuit 10, a fractional-N PLL circuit 20, a divider circuit 30, an output circuit 40, a regulator 50, a regulator 60, a control circuit 70, a serial interface (I/F) circuit 80, and a nonvolatile memory 90. It should be noted that the oscillation circuit 2 according to the present embodiment can be provided with a configuration obtained by eliminating or modifying some of these constituents, or adding other constituents. The oscillation circuit 2 can be a semiconductor integrated circuit (IC) formed as a single-chip, or can be formed of a plurality of chips of IC, or can partially be constituted by discrete components.

The oscillating circuit 10 is a circuit for oscillating the resonator 3, and amplifies an output signal of the resonator 3 and then feeds the output signal thus amplified back to the resonator 3. The oscillating circuit 10 outputs a clock signal (oscillation signal) REFCLK based on the oscillation of the resonator 3. For example, the oscillation circuit constituted by the resonator 3 and the oscillating circuit 10 can also be a variety of types of oscillation circuit such as a pierce oscillation circuit, an inverter-type oscillation circuit, a Colpitts oscillation circuit, or a Hartley oscillation circuit.

The fractional-N PLL circuit 20 generates a clock signal PLLCLK obtained by multiplying the frequency (a reference frequency) of the clock signal REFCLK by an integer or by (an integer)+(a fraction) in accordance with a frequency division ratio input from the control circuit 70. Here, denoting an integer part (an integer frequency division ratio) of the frequency division ratio by N, and a fractional part (a fractional frequency division ratio) thereof by F/M, a relationship expressed by the following formula (1) is made true between the frequency $f_{REFCLK}$ of the clock signal REFCLK and the frequency $f_{PLLCLK}$ of the clock signal PLLCLK.

$$f_{PLLCLK} = \left(N + \frac{F}{M}\right) \times f_{REFCLK} \quad (1)$$

The divider circuit 30 divides the frequency of the clock signal PLLCLK output by the fractional-N PLL circuit 20 at an output frequency division ratio P (P is an integer no smaller than 1) input from the control circuit 70 to generate a clock signal CLKO. Here, a relationship expressed by the following formula (2) is made true between the frequency $f_{PLLCLK}$ of the clock signal PLLCLK and the frequency $f_{CLKO}$ of the clock signal CLKO.

$$f_{CLKO} = \frac{f_{PLLCLK}}{P} \quad (2)$$

Therefore, a relationship expressed by the following formula (3) is made true between the frequency $f_{REFCLK}$ of the clock signal REFCLK and the frequency $f_{CLKO}$ of the clock signal CLKO from the formula (1) and the formula (2).

$$f_{CLKO} = \left(N + \frac{F}{M}\right) \times \frac{f_{REFCLK}}{P} \quad (3)$$

The output circuit 40 converts the clock signal CLKO output by the divider circuit 30 into a differential signal consisting of a non-inverted signal CKP and an inverted signal CKN. The non-inverted signal CKP is output from the output terminal OUT_P to the outside, and the inverted signal CKN is output from the output terminal OUT_N to the outside. The output circuit 40 can also be a differential output circuit such as an LVDS (Low Voltage Differential Signaling) circuit, a PECL (Positive Emitter Coupled Logic) circuit, or an LVPECL (Low Voltage PECL) circuit. It should be noted that the output circuit 40 can be a single-ended output circuit.

The regulator 50 generates a constant voltage Vreg1 lower than the power supply voltage Vcc supplied from the Vcc terminal based on the power supply voltage Vcc. The constant voltage Vreg1 is supplied as a power supply voltage for the oscillating circuit 10 and a power supply voltage for some circuits in the fractional-N PLL circuit 20.

The regulator 60 generates a constant voltage Vreg2 lower than the power supply voltage Vcc supplied from the Vcc terminal based on the power supply voltage Vcc. The constant voltage Vreg2 is supplied as a power supply voltage for some circuits in the fractional-N PLL circuit 20 and a power supply voltage for the divider circuit 30.

Although the constant voltage Vreg1 and the constant voltage Vreg2 are the same voltage in the present embodiment, the constant voltage Vreg1 and the constant voltage Vreg2 can be different from each other as long as no false operation occurs in an interface part between the circuit using the constant voltage Vreg1 as the power supply voltage and the circuit using the constant voltage Vreg2 as the power supply voltage.

In the present embodiment, the serial interface circuit 80 is a digital interface circuit compliant with the I²C standard, and a serial data signal is input/output from/to the SDA terminal to/from the serial interface circuit 80, and a clock signal is input from the SCL terminal to the serial interface circuit 80. There is adopted a configuration in which reading/writing from/to control registers not shown and the nonvolatile memory 90 provided to the control circuit 70 can be performed from an external device via the SDA terminal, SCL terminal and the serial interface circuit 80. It should be noted that the serial interface circuit 80 can be an interface circuit compliant with another communication standard than I²C. Further, it is not required for the oscillator 1 to be provided with the external terminals (the SDA terminal and the SCL terminal in FIG. 1) dedicated to the interface, and it is possible to adopt a configuration in which the OUT_P terminal and the OUT_N terminal, or functional terminals not shown are used also as the external terminals for the interface by, for example, switching the mode from the outside.

The control circuit 70 has the control registers not shown, and controls respective operations of the oscillating circuit 10, the fractional-N PLL circuit 20, and the divider circuit 30 in accordance with setting values of the control registers. In the control registers, there can be set a frequency adjustment value and so on of the oscillating circuit 10, the integer frequency division ratio N and the fractional frequency division ratio F/M of the fractional-N PLL circuit 20, the output frequency division ratio P of the division circuit 30, and so on. In the present embodiment, the external device sets the integer frequency division ratio N, the fractional frequency division ratio F/M, and the output frequency division ratio P and then supplies them to the fractional-N PLL circuit 20 via the serial interface circuit 80. Then, the divider circuit 30 divides the frequency of the clock signal PLLCLK in accordance with the output frequency division ratio P, and the clock signal with the frequency set by the formula (3) is output from the OUT_P terminal and the OUT_N terminal.

The nonvolatile memory 90 is realized by an EEPROM (Electrically Erasable Programmable Read-Only Memory) or the like, and stores data necessary when starting up (when powering on) the oscillator 1, and so on. For example, in the nonvolatile memory 90, there can be stored control data of the frequency adjustment and so on of the oscillation controlling circuit, initial values of the integer frequency division ratio N, the fractional frequency division ratio F/M, and the output frequency division ratio P, and so on. The control circuit 70 retrieves the data stored in the nonvolatile memory 90 and then sets them in the control registers when starting up (when powering on) the oscillator 1 and so on to perform a variety of types of control.

(1-1) Configuration of Fractional-N PLL Circuit

Figure 2:
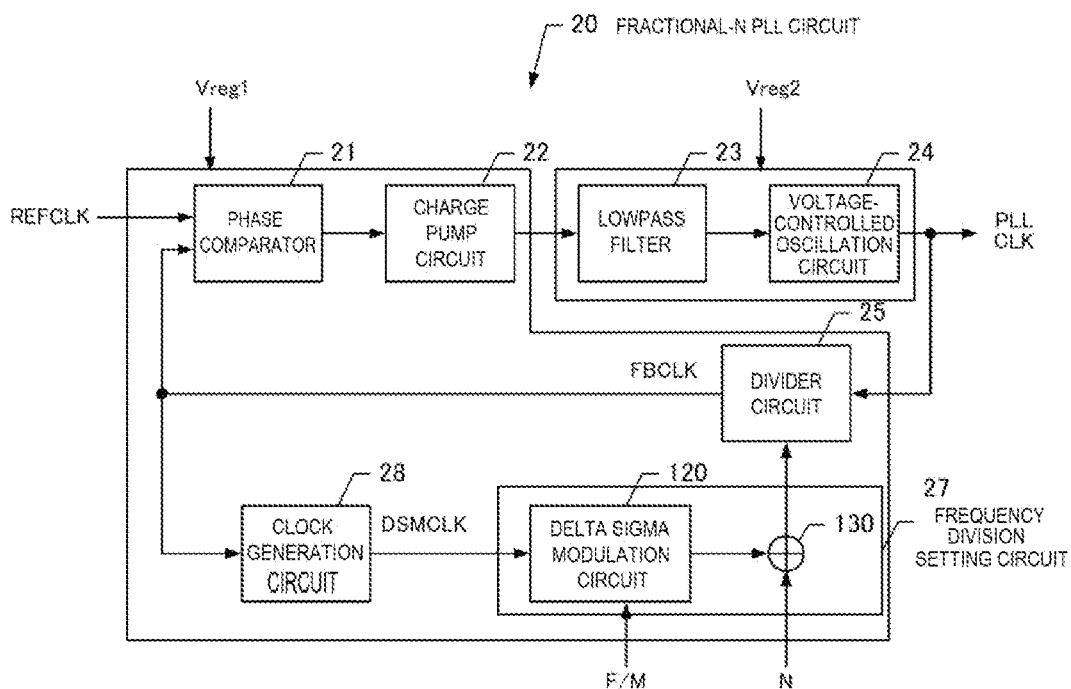
FIG. 2 is a diagram showing a fractional-N PLL circuit.

FIG. 2 is a diagram showing a configuration example of the fractional-N PLL circuit 20 in the first embodiment. As shown in FIG. 2, the fractional-N PLL circuit 20 is configured including a phase comparator (PFD: Phase Frequency Detector) 21, a charge pump circuit (CP: Charge Pump) 22, a lowpass filter (LPF: Lowpass Filter) 23, a voltage-controlled oscillation circuit (VCO) 24, a divider circuit 25, a frequency division setting circuit 27, and a clock generation circuit 28.

The phase comparator 21 compares the phase of the clock signal REFCLK output by the oscillating circuit 10 and the phase of a clock signal FBCLK as a feedback signal output by the divider circuit 25 with each other, and then outputs the comparison result as a pulse voltage.

The charge pump circuit 22 converts the pulse voltage output by the phase comparator 21 into a current. The lowpass filter 23 smoothes the current output by the charge pump circuit 22 to convert the result into a voltage. The voltage-controlled oscillation circuit 24 outputs the clock signal PLLCLK the frequency of which varies in accordance with a control voltage using the output voltage of the lowpass filter 23 as the control voltage. It is possible for the voltage-controlled oscillation circuit 24 to set a plurality of output frequency ranges with respect to the control voltage range.

The divider circuit 25 is disposed on a signal path from the output of the voltage-controlled oscillation circuit 24 to the input of the voltage-controlled oscillation circuit 24, and outputs the clock signal FBCLK obtained by dividing the frequency of the clock signal PLLCLK output by the voltage-controlled oscillation circuit 24 taking the output signal of the frequency division setting circuit 27 as the frequency division ratio. A time mean value of the output signal of the frequency division setting circuit 27 coincides with a sum (N+F/M) of the integer frequency division ratio N and the fractional frequency division ratio F/M input from the control circuit 70. Further, in a steady state in which the phase of the clock signal REFCLK and the phase of the clock signal FBCLK are synchronized with each other, the frequency of the clock signal PLLCLK calculated by the formula (1) coincides with the frequency of the clock signal REFCLK, and thus, the frequency of the clock signal CLKO becomes the desired frequency (a target frequency) expressed by the formula (3).

The frequency division setting circuit 27 performs the delta sigma modulation using the fractional frequency division ratio F/M to set the frequency division ratio of the divider circuit 25. In the present embodiment, the frequency division setting circuit 27 is configured including a delta-sigma modulation circuit 120 and an adder-subtractor circuit 130. The delta-sigma modulation circuit 120 performs the delta sigma modulation of integrating the fractional frequency division ratio F/M to quantize the fractional frequency division ratio F/M in sync with a clock signal DSMCLK output by the clock generation circuit 28. The adder-subtractor circuit 130 performs addition/subtraction between a delta-sigma modulation signal output by the delta-sigma modulation circuit 120 and the integer frequency division ratio N. The output signal of the adder-subtractor circuit 130 is input to the divider circuit 25 as the output signal of the frequency division setting circuit 27. In the output signal of the frequency division setting circuit 27, a plurality of integer frequency division ratios in a range around the integer frequency division ratio N changes in a time-series manner, and the time mean value of the plurality of integer frequency division ratios coincides with N+F/M.

For example, assuming the frequency of the clock signal REFCLK as 100 MHz, and the target frequency of the clock signal PLLCLK as 3425 MHz, it is necessary for the time mean value of the output signal of the frequency division setting circuit 27, namely the time mean value of the frequency division ratio of the divider circuit 25, to be 34.25. Therefore, the integer frequency division ratio N should be set to 34, and the fractional frequency division ratio F/M should be set to 0.25.

Since the value 34.25 is not an integer, by varying the frequency division ratio (an integer) of the divider circuit 25 in a time-series manner using the delta sigma modulation by the delta-sigma modulation circuit 120, the frequency division ratio of 34.25 is approximately realized. For example, when dividing a certain predetermined period into a plurality of periods, the frequency division ratio of the divider circuit 25 is set to 34 in three fourths of the plurality of periods thus divided into, and the frequency division ratio of the divider circuit 25 is set to 35 in the rest fourth of the periods, it is possible to achieve the approximation to the frequency division of 34.25 in view of the number of pulses of the clock signal FBCLK in that predetermined period.

(1-2) Configuration of Charge Pump Circuit

As described above, the oscillator 1 according to the present embodiment is provided with the charge pump circuit 22. The charge pump circuit 22 converts the pulse voltage output by the phase comparator 21 into a current, and the current thus converted into is smoothed by the lowpass filter 23 to be converted into a voltage. Regarding the charge pump circuit 22, there has been known a configuration provided with a voltage follower circuit as in the related art. However, in the related-art configuration, there is a limitation in the value of the current which should be made to flow using the voltage follower circuit, and as a result, the degree of freedom in selecting the power consumption in the voltage follower circuit is low.

Figure 3:
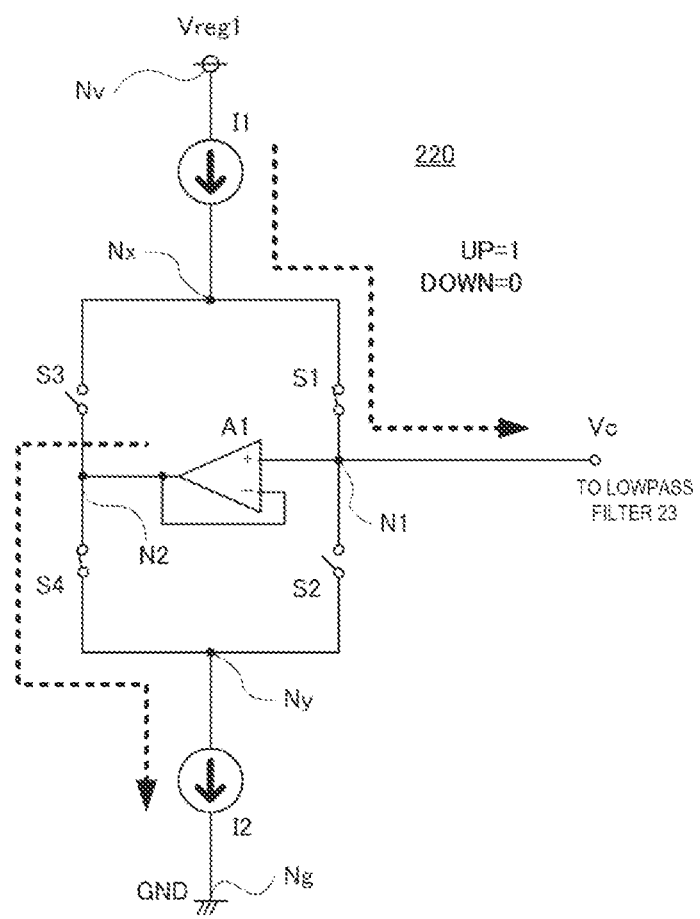
FIG. 3 is a diagram showing a charge pump circuit.

FIG. 3 is a diagram showing a circuit as a charge pump circuit 220 which is the related art of the charge pump circuit 22 according to the present embodiment. The charge pump circuit 220 is a circuit used as a replacement for the charge pump circuit 22 shown in FIG. 2. Specifically, the charge pump circuit 220 is provided with a first current source I1, a second current source I2, a first switch S1 through a fourth switch S4, and an operational amplifier circuit A1 as shown in FIG. 3.

The charge pump circuit 220 is configured as a circuit between the power supply terminal supplied with the power supply voltage and the GND terminal. The power supply terminal is supplied with, for example, the power supply voltage Vreg1 generated by the regulator 50 described above. In the charge pump circuit 220, the power supply terminal corresponds to a high potential power supply node Nv, and the GND terminal corresponds to a low potential power supply node Ng.

The first current source I1 is coupled between the high potential power supply node Nv and a first node N1, and the second current source I2 is coupled between the low potential power supply node Ng and the first node N1. Further, the first switch S1 is coupled between the first current source I1 and the first node N1, and the second switch S2 is coupled between the second current source I2 and the first node N1. Further, the third switch S3 is coupled between the first current source I1 and a second node N2, and the fourth switch S4 is coupled between the second current source I2 and the second node N2.

An output terminal of the operational amplifier circuit A1 is coupled to the second node N2, and a non-inverting input terminal of the operational amplifier circuit A1 is coupled to the first node N1. An inverting input terminal of the operational amplifier circuit A1 is coupled to the output terminal of the operational amplifier circuit A1, and thus, the voltage follower circuit is formed. It should be noted that the non-inverting input terminal of the operational amplifier circuit A1 is described as + in FIG. 3, and the inverting input terminal is described as − in FIG. 3. It should be noted that the first node N1 is a node Vc from which the phase difference current is output, and is an input node of the lowpass filter 23 in the posterior stage.

The first switch S1 through the fourth switch S4 are switches which operate in accordance with a phase-lag control signal and a phase-lead control signal output by the phase comparator 21. It should be noted that in the present embodiment, the phase-lead control signal is output when the clock signal REFCLK leads the clock signal FBCLK which has been fed back. Further, the phase-lag control signal is output when the clock signal REFCLK lags behind the clock signal FBCLK which has been fed back. In the present embodiment, the phase-lead control signal is referred to as an UP signal, and the phase-lag control signal is referred to as a DOWN signal.

Further, the first switch S1 is set to an ON state when the UP signal is in a high level, and is set to an OFF state when the UP signal is in a low level. The second switch S2 is set to the ON state when the DOWN signal is in the high level, and is set to the OFF state when the DOWN signal is in the low level. The third switch S3 is set to the OFF state when the UP signal is in the high level, and is set to the ON state when the UP signal is in the low level. The fourth switch S4 is set to the OFF state when the DOWN signal is in the high level, and is set to the ON state when the DOWN signal is in the low level.

Figure 4:
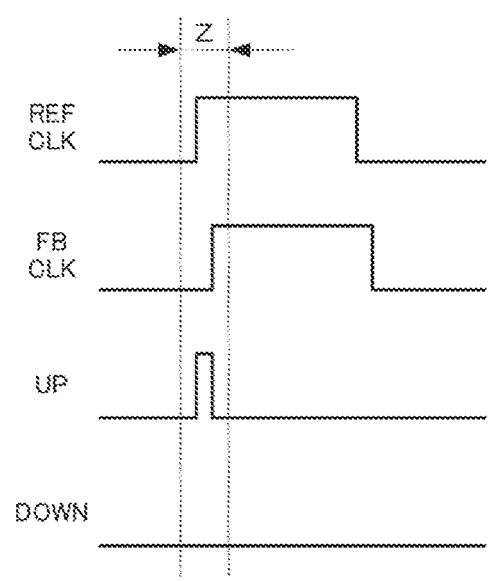
FIG. 4 is a diagram showing a timing chart of signals related to the charge pump circuit.

The charge pump circuit 220 controls the current output from the first node N1 to the lowpass filter 23 so as to lead or lag the phase of the clock signal FBCLK in accordance with the UP signal and the DOWN signal. FIG. 4 is a diagram showing a relationship between the clock signal REFCLK, the clock signal FBCLK, the UP signal, and the DOWN signal. In FIG. 4, there is shown an example in which the clock signal FBCLK lags behind the clock signal REFCLK. In this case, the UP signal is output in the period in which the clock signal REFCLK is in the high level while the clock signal FBCLK is in the low level. In this example, since the clock signal REFCLK leads, the DOWN signal is not output. This state is referred to as UP=1, DOWN=0.

In contrast, when the clock signal FBCLK leads the clock signal REFCLK, the DOWN signal is output in the period in which the clock signal FBCLK is in the high level while the clock signal REFCLK is in the low level. In this case, since the clock signal REFCLK lags, the UP signal is not output. This state is referred to as UP=0, DOWN=1. Further, when the clock signal REFCLK and the clock signal FBCLK coincide in phase with each other, neither the UP signal nor the DOWN signal is output. This state is the state in which the fractional-N PLL circuit 20 locks. This state is referred to as UP=0, DOWN=0.

As described above, in the charge pump circuit 220, there can be assumed the three states different in combination of the UP signal and the DOWN signal, and when outputting the currents corresponding to the respective states, it is possible to perform the control so that the clock signal FBCLK coincides with the clock signal REFCLK.

For example, in the case of UP=1, DOWN=0, when the charge pump circuit 220 increases the current to be supplied to the first node N1, it is possible to lead the phase of the clock signal FBCLK. Therefore, in the case of UP=1, DOWN=0, by setting the first switch S1, the second switch S2, the third switch S3, and the fourth switch S4 to ON, OFF, OFF, and ON, respectively, as shown in FIG. 3, it is possible to supply the current from the first node N1 toward the lowpass filter 23 with the first current source I1. Further, in this state, since the third switch S3 is in the OFF state and the fourth switch S4 is in the ON state, the current flows from the output terminal of the operational amplifier circuit A1 to the low potential power supply node Ng via the second node N2, the fourth switch S4, and the second current source I2. In FIG. 3, these currents are represented by the dotted arrows.

Figure 5:
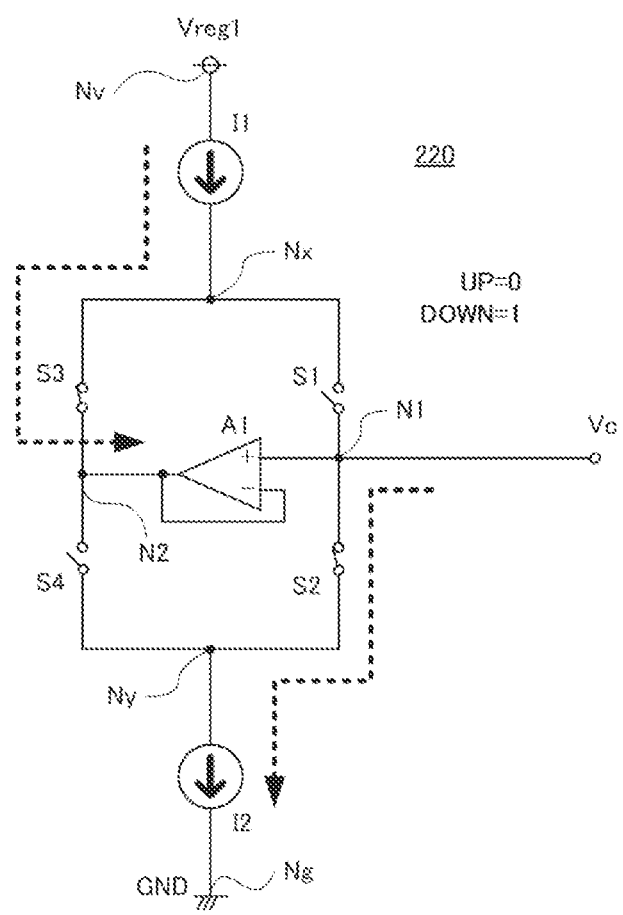
FIG. 5 is a diagram showing the charge pump circuit.

In the case of UP=0, DOWN=1, when the charge pump circuit 220 decreases the current to be supplied to the first node N1, it is possible to lag the phase of the clock signal FBCLK. Therefore, in the case of UP=0, DOWN=1, by setting the first switch S1, the second switch S2, the third switch S3, and the fourth switch S4 to OFF, ON, ON, and OFF, respectively, as shown in FIG. 5, it is possible to draw the current from the first node N1 toward the low potential power supply node Ng with the second current source I2. Further, in this state, since the third switch S3 is in the ON state and the fourth switch S4 is in the OFF state, the current flows from the first current source I1 toward the output terminal of the operational amplifier circuit A1. In FIG. 5, these currents are represented by the dotted arrows.

Figure 6:
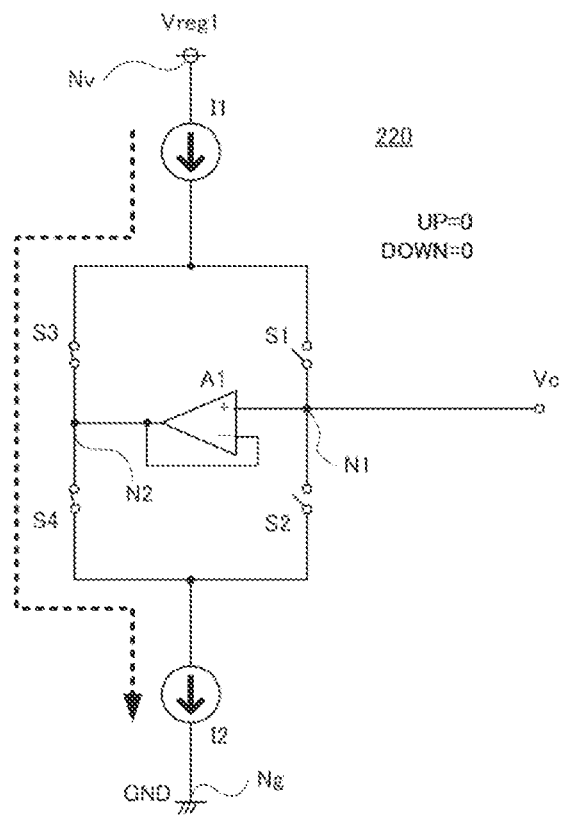
FIG. 6 is a diagram showing a charge pump circuit.

Further, in the case of UP=0, DOWN=0, there is no need to supply the current from the charge pump circuit 220 to the first node N1, and there is no need to draw the current from the first node N1. Therefore, in the case of UP=0, DOWN=0, by setting the first switch S1, the second switch S2, the third switch S3, and the fourth switch S4 to OFF, OFF, ON, and ON, respectively, as shown in FIG. 6, there is created the state in which no current is supplied to or drawn from the first node N1. On this occasion, the current flows to the low potential power supply node Ng via the first current source I1 and the second current source I2. In FIG. 6, these currents are represented by the dotted arrows. It should be noted that in the charge pump circuit 220, since the current output from the first current source I1 flows through the second current source I2 in this state, there is adopted the design in which an amount of the current supplied by the first current source I1 and the second current source, and an amount of the current drawn by the first current source I1 and the second current source are the same.

As described above, since the state is switched in accordance with the combination of the UP signal and the DOWN signal in the charge pump circuit 220, the voltages at the first node N1 and the second node N2 can dramatically vary in accordance with the change in the switches unless the operational amplifier circuit A1 functioning as the voltage follower circuit exists. For example, when the operational amplifier circuit A1 does not exist in the state shown in FIG. 3, since the third switch S3 is in the OFF state and the fourth switch S4 is in the ON state, the voltage at a node Ny comes closer to the voltage at the low potential power supply node Ng.

The voltage at the first node N1 coupled to an input terminal of the lowpass filter 23 is different from the voltage at the low potential power supply node Ng. However, since the node Ny is coupled to the first node N1 when switching from the state shown in FIG. 3 to the state shown in FIG. 5 occurs, the voltage can rapidly vary at the first node N1. The same applies to a node Nx, and unless the operational amplifier circuit A1 exists, the voltage at the node Nx comes closer to the voltage at the high potential power supply node Nv, and when switching from the state shown in FIG. 5 to the state shown in FIG. 3 occurs, the voltage at the first node N1 rapidly changes.

However, when the operational amplifier circuit A1 functioning as the voltage follower circuit is coupled between the first node N1 and the second node N2, the voltages at the first node N1 and the second node N2 are controlled so as to be the same as each other. Therefore, the voltage variation at the first node N1 due to the changes of the switches is prevented, and it is possible to stabilize the operations in the lowpass filter 23 and the voltage-controlled oscillation circuit 24.

The operational amplifier circuit A1 functioning as the voltage follower circuit in such a manner is capable of supplying the current to the second current source I2 as shown in FIG. 3, and at the same time, required to draw the current supplied from the first current source I1 as shown in FIG. 5. Therefore, as the configuration, there can be cited, for example, a push-pull type operational amplifier circuit. However, the push-pull type operational amplifier circuit is relatively large in the number of transistors, and there is a problem that the noise increases.

Figure 7:
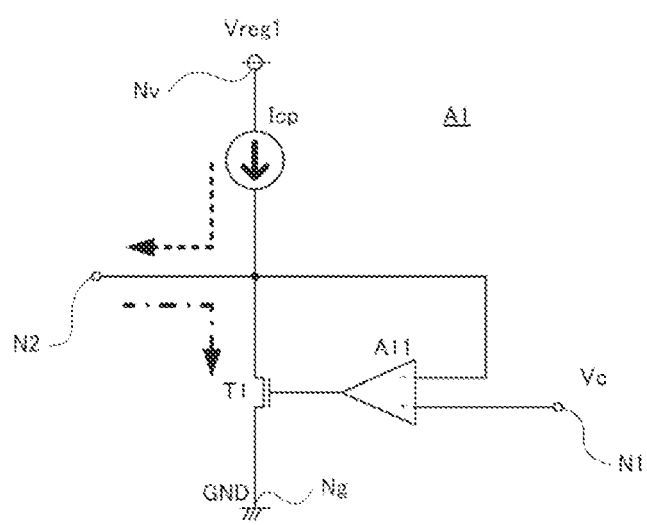
FIG. 7 is a diagram showing a pull-type differential amplifier circuit.

Therefore, it is possible to adopt a configuration in which a current source having an equivalent current supply capacity to that of the second current source I2 is disposed in the output stage in the operational amplifier circuit A1 of such a pull type as shown in FIG. 7. In other words, it is possible to adopt a configuration in which a pull operation as one of the push-pull operations is performed by the operational amplifier circuit A1, and the push side is supplemented by a current source Icp having the same current supply capacity as that of the first current source I1 or the second current source I2.

Specifically, the operational amplifier circuit A1 shown in FIG. 7 is provided with an operational amplifier A11, a non-inverting input terminal is coupled to the first node N1 (an output node Vc of the charge pump circuit 220), and the gate of an NMOS transistor T1 is coupled to an output terminal. An inverting input terminal of the operational amplifier A11 is coupled to the second node N2. Further, the current source Icp is coupled between the second node N2 and the high potential power supply node Nv. Further, the drain of the NMOS transistor T1 is coupled to the second node N2, and the source of the NMOS transistor T1 is coupled to the low potential power supply node Ng.

In the charge pump circuit 220 in which such an operational amplifier circuit A1 is used, when the state of UP=1, DOWN=0 is realized as shown in FIG. 3, it is necessary for the current to flow from the operational amplifier circuit A1 toward the second current source I2 as indicated by the dotted line shown in FIG. 7. Therefore, it is necessary for the current source Icp to be the same in current supply capacity as the second current source I2, and the current the same in current value as the current of the second current source I2 flows through the operational amplifier circuit A1. In the charge pump circuit 220, when the state of UP=0, DOWN=1 is realized as shown in FIG. 5, the current is supplied from the first current source I1 to the operational amplifier circuit A1 as indicated by the dashed-dotted line shown in FIG. 7.

In contrast, in the charge pump circuit 220, when the state of UP=0, DOWN=0 is realized as shown in FIG. 6, there is no need to supply the current from the second node N2 to the operational amplifier circuit A1, and there is no need to draw the current from the second node N2. However, in the operational amplifier circuit A1, since the current source Icp is provided, a current equivalent to the current due to the second current source I2 flows through the NMOS transistor T1 even in this case.

In other words, in the related-art charge pump circuit 220, the current equivalent to the current due to the second current source I2 always flows through the operational amplifier circuit A1 even in the state in which neither the supply nor the drawing of the current is performed. Further, since the state of UP=0, DOWN=0 corresponds to the state in which the fractional-N PLL circuit 20 locks, the state in which the fractional-N PLL circuit 20 locks normally lasts longer than other states. Therefore, in the operational amplifier circuit A1 related to the related-art charge pump circuit 220, the current which does not engage with the supply of the current or the drawing of the current continues to flow for a long period of time to increase the power consumption.

However, in the related-art charge pump circuit 220, the current source Icp constituting the operational amplifier circuit A1 is required to have the current supply capacity of flowing a current equivalent to that of the second current source I2, and it is unachievable to change the design so as to suppress the current value. Therefore, in the charge pump circuit 22 according to the present embodiment, it is arranged that one of the three states described above, namely the state of UP=0, DOWN=1 does not occur (or hardly occurs).

Figure 8:
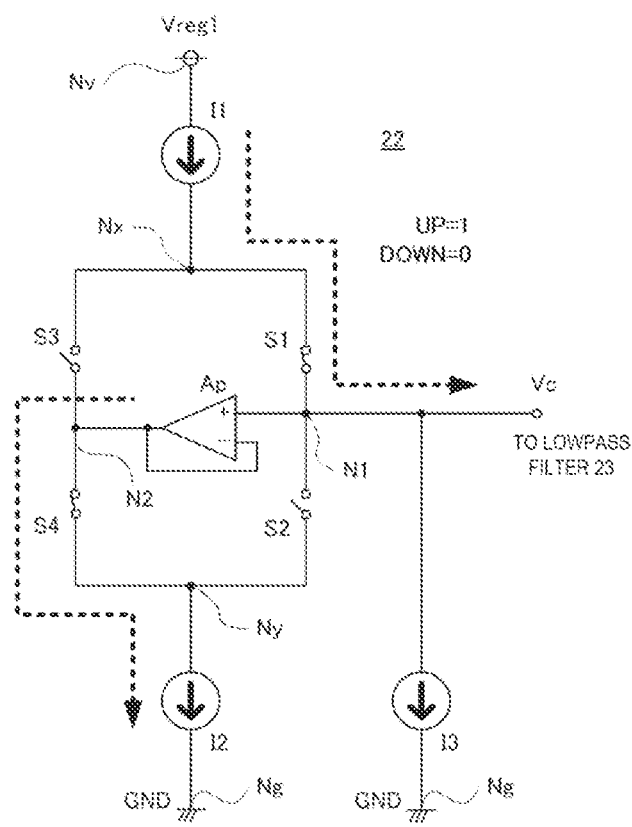
FIG. 8 is a diagram showing a charge pump circuit.

Specifically, in the charge pump circuit 22, a push-type differential amplifier circuit Ap is used instead of the operational amplifier circuit A1 in the related-art charge pump circuit 220, and further, a third current source I3 is coupled between the first node N1 and the low potential power supply node Ng. FIG. 8 is a diagram showing a configuration of the charge pump circuit 22 according to the present embodiment. It should be noted that a specific example of the push-type differential amplifier circuit Ap will be described later.

Figure 9:
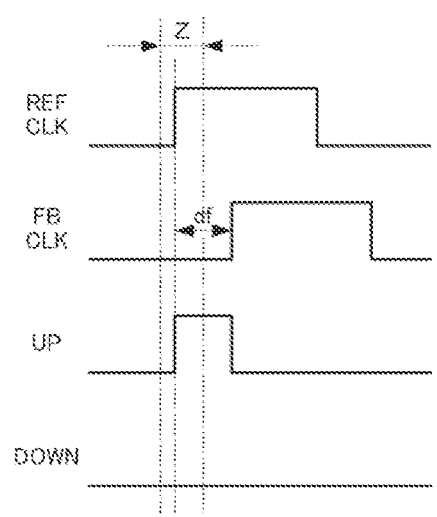
FIG. 9 is a diagram showing a timing chart of signals related to the charge pump circuit.

In FIG. 8, the constituents the same as those in the charge pump circuit 220 are shown with the same reference symbols attached. The third current source I3 is a current source of supplying a negative offset current to the first node N1. In other words, the third current source I3 functions as a current source of drawing a continuous current from the first node N1. FIG. 9 is a diagram for explaining a relationship between the clock signal REFCLK, the clock signal FBCLK, the UP signal, and the DOWN signal when using the charge pump circuit 22. In FIG. 9, there is shown the state in which the fractional-N PLL circuit 20 locks. Specifically, in the charge pump circuit 22 according to the present embodiment, a current is always drawn from the first node N1 with the third current source I3. Therefore, due to the current drawn by the third current source I3, the phase of the clock signal FBCLK is always provided with a certain offset df toward a direction (the rightward direction in the drawing) of lagging an amount of the phase.

In the example shown in FIG. 9, since the clock signal FBCLK lags behind the clock signal REFCLK as much as the offset df, the state of UP=1, DOWN=0 is created for a period corresponding to the offset df. In this case, as shown in FIG. 8, the first switch S1 through the fourth switch S4 are set to ON, OFF, OFF, and ON, respectively. Therefore, the current is supplied from the first current source I1 to the first node N1. In the present embodiment, when the lag of the clock signal FBCLK with respect to the clock signal REFCLK coincides with the offset df of the phase, the phase of the clock signal FBCLK does not change, and the state in which the fractional-N PLL circuit 20 locks is created. In other words, the lock state means the state in which the current supplied from the first current source I1 and the current drawn by the third current source I3 balance with each other in the period of UP=1, DOWN=0. In the case of the example shown in FIG. 9, the lock state is created when the relationship of $(df \times Ic_1 = 2\pi \times Ic_3)$ is made true between the offset df of the phase, the current $Ic_1$ to be supplied from the first current source, and the current $Ic_3$ to be drawn by the third current source.

In the present embodiment, since the phase of the clock signal FBCLK is provided with the offset so as to lag behind the phase of the clock signal REFCLK due to the configuration described above, the state of DOWN=1 does not occur (or hardly occurs). Therefore, in the push-type differential amplifier circuit Ap according to the present embodiment, it becomes unnecessary to assume the operation in the state of UP=0, DOWN=1.

Therefore, in the charge pump circuit 22 according to the present embodiment, there is no need to draw the current to be drawn from the second node N2 into the push-type differential amplifier circuit Ap. Therefore, the push-type differential amplifier circuit Ap is used as the voltage follower circuit provided to the charge pump circuit 22.

Figure 10:
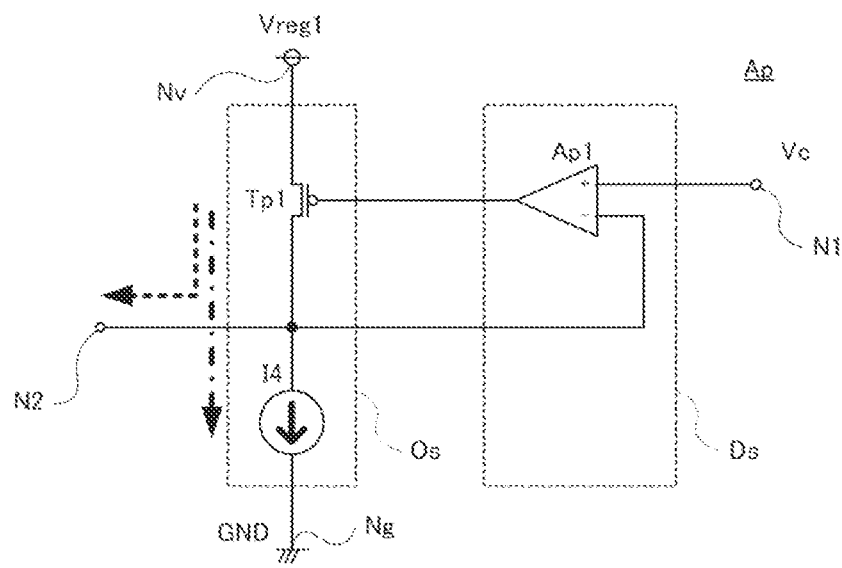
FIG. 10 is a diagram showing a push-type differential amplifier circuit.

FIG. 10 is a diagram showing a configuration example of the push-type differential amplifier circuit Ap. The push-type differential amplifier circuit Ap shown in FIG. 10 includes an output stage Os and a differential stage Ds. The output stage Os is provided with a PMOS transistor Tp1 and a fourth current source I4. The PMOS transistor Tp1 is disposed between the high potential power supply node Nv and the second node N2, the source of the PMOS transistor Tp1 is coupled to the high potential power supply node Nv, and the drain thereof is coupled to the second node N2. The fourth current source I4 is disposed between the second node N2 and the low potential power supply node Ng.

The differential stage Ds is provided with an operational amplifier Ap1, a non-inverting input terminal is coupled to the first node N1 (an output node Vc of the charge pump circuit 22), and the gate of a PMOS transistor Tp1 is coupled to an output terminal. An inverting input terminal of the operational amplifier Ap1 is coupled to the second node N2.

In the charge pump circuit 22 in which such a push-type differential amplifier circuit Ap is used, when the state of UP=1, DOWN=0 is realized as shown in FIG. 3, it is necessary for the current to flow from the push-type differential amplifier circuit Ap toward the second node N2 as indicated by the dotted line shown in FIG. 10. This current is supplied from the high potential power supply node Nv side by the PMOS transistor Tp1 operating in accordance with the control by the operational amplifier Ap1. In contrast, in the charge pump circuit 22, there is adopted the configuration in which the state of UP=0, DOWN=1 is not realized. Therefore, it is unnecessary for the push-type differential amplifier circuit Ap to draw such a high current as the current by the first current source I1 from the second node N2.

Figure 11:
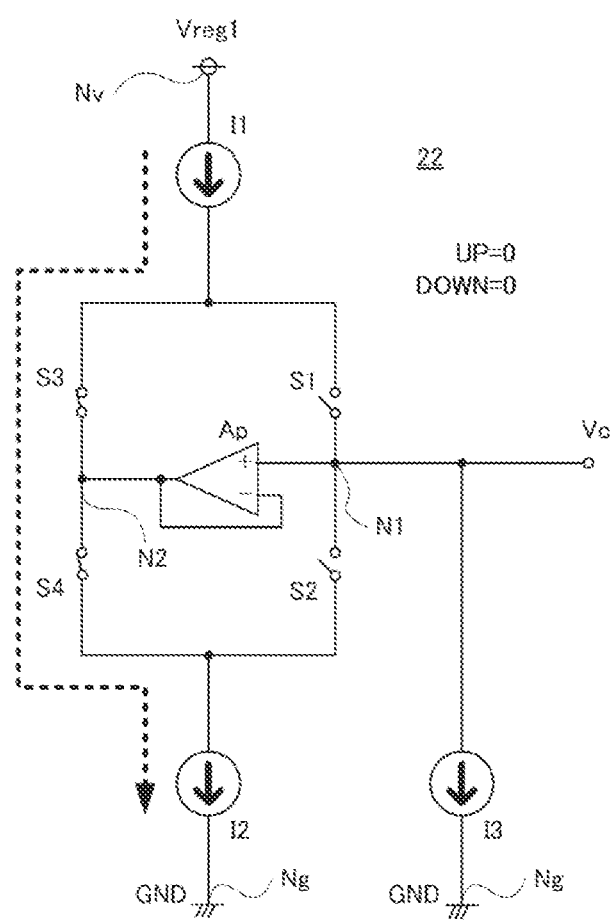
FIG. 11 is a diagram showing a charge pump circuit.

Further, in the charge pump circuit 22, when the state of UP=0, DOWN=0 is realized as shown in FIG. 11, there is no need to supply the current from the second node N2 to the push-type differential amplifier circuit Ap, and there is no need to draw the current from the second node N2. Therefore, in this state, it is sufficient for the current to flow from the high potential power supply node Nv to the low potential power supply node Ng via the PMOS transistor Tp1 and the fourth current source I4 as indicated by the dashed-dotted line in the push-type differential amplifier circuit Ap. The current value of this current is the value of the current flowing due to the fourth current source I4 as a constant current source, but the fourth current source I4 is not required to draw the current from the first current source I1, and is not required to supply the current to the second current source I2.

Therefore, the current supply capacity of the fourth current source I4 does not depend on the first current source I1 and the second current source I2. Therefore, it is sufficient for the fourth current source I4 to have the current supply capacity enough to supply a current sufficient to operate the push-type differential amplifier circuit Ap. For example, by making the current supply capacity of the fourth current source I4 lower than those of the first current source I1 and the second current source I2, it is possible to reduce the power consumption to be lower than that of the related-art charge pump circuit 220. Specifically, in many cases, it is possible for the current Ib flowing due to the fourth current source I4 to fulfill Ib<Ic with respect to the current Ic flowing due to the first current source I1 and the second current source I2. For example, it becomes easy to make the design in the order that the current Ib is in a range of 20 through 30 μA and the current Ic is in a range of 400 through 800 μA.

Further, since the current supply capacity of the fourth current source I4 does not depend on the first current source I1 and the second current source I2, the degree of freedom in making the design corresponding to the frequency of the clock signal REFCLK in the fractional-N PLL circuit 20 also increases. Specifically, the current flowing through the PMOS transistor Tp1 depends on the fourth current source I4. Further, the higher the current supply capacity of the fourth current source I4 becomes, the higher the maximum value of the current which can flow through the PMOS transistor Tp1 becomes. Further, the fact that the maximum value of the current which can flow through the PMOS transistor Tp1 becomes higher means that the gain of the operational amplifier Ap1 becomes higher.

When the gain of the operational amplifier Ap1 becomes higher, the quick reaction capability in the operation as the voltage follower circuit for making the voltage at the first node N1 and the voltage at the second node N2 coincide with each other becomes higher. When the frequency of the clock signal REFCLK becomes high, there arises the necessity of increasing the quick reaction capability of the voltage follower circuit in some cases. According to the charge pump circuit 22 related to the present embodiment, since it is possible to change the current supply capacity of the fourth current source I4, it is easy to make the design corresponding to when the frequency of the clock signal REFCLK is high.

In the charge pump circuit 22 according to the present embodiment, it is sufficient for the third current source I3 to be configured so that the offset df is provided to the phase of the clock signal FBCLK to thereby practically prevent the state of UP=0, DOWN=1 from occurring. Therefore, the current supply capacity in the third current source I3 as the constant current source can be lower than those of the first current source I1 and the second current source I2.

Further, according to the configuration in which the third current source I3 provides the phase of the clock signal FBCLK with the offset df, it is possible to prevent the deterioration in phase setting accuracy due to a dead zone of the phase comparator. Specifically, in the phase comparator, in general, the UP signal and the DOWN signal are output in accordance with the phase difference between the clock signal FBCLK and the clock signal REFCLK to adjust the phase difference using the charge pump circuit, the voltage-controlled oscillation circuit, and so on. However, when the UP signal and the DOWN signal become an excessively short pulse, there is a problem that it becomes unachievable to detect an existing phase difference.

In other words, in the phase comparator 21, there exists the dead zone in which the phase shift cannot be detected with respect to both of when the phase of the clock signal FBCLK lags and when the phase thereof leads. In FIG. 4 and FIG. 9, the dead zone Z is represented by the dotted lines. The example shown in FIG. 4 corresponds to an example in which the UP signal is included in the dead zone. Therefore, a minute difference in phase between the clock signal REFCLK and the clock signal FBCLK shown in this example is not detected by the phase comparator 21.

In contrast, in the charge pump circuit 22 according to the present embodiment, the third current source I3 always provides the phase of the clock signal FBCLK with the offset. As a result, as described above, in the phase comparator 21 using the charge pump circuit 22, the lock state is created when the lag of the clock signal FBCLK with respect to the clock signal REFCLK coincides with the offset df of the phase. In other words, by providing the charge pump circuit 22 with the third current source I3, the pulse width of the UP signal in the lock state becomes larger as shown in FIG. 9 compared to that shown in FIG. 4. Therefore, the situation in which the pulse width of the UP signal before the lock is included in the dead zone does not occur. Therefore, by using the charge pump circuit 22 according to the present embodiment, it is possible to prevent the deterioration in phase setting accuracy due to the dead zone of the phase comparator.

As described above, in order to prevent the deterioration in phase setting accuracy with the offset df of the phase due to the third current source I3, it is sufficient to design the current value of the third current source I3 so that the pulse width of the UP signal in the lock state becomes wide enough not to be included in the dead zone. It should be noted that each of the first current source I1, the second current source I2, the third current source I3, and the fourth current source I4 is a constant current source, and can be formed of a variety of types of circuit such as a current mirror circuit, or a self-biased depletion MOS transistor.

(1-3) Specific Example of Push-Type Differential Amplifier Circuit

Figure 12:
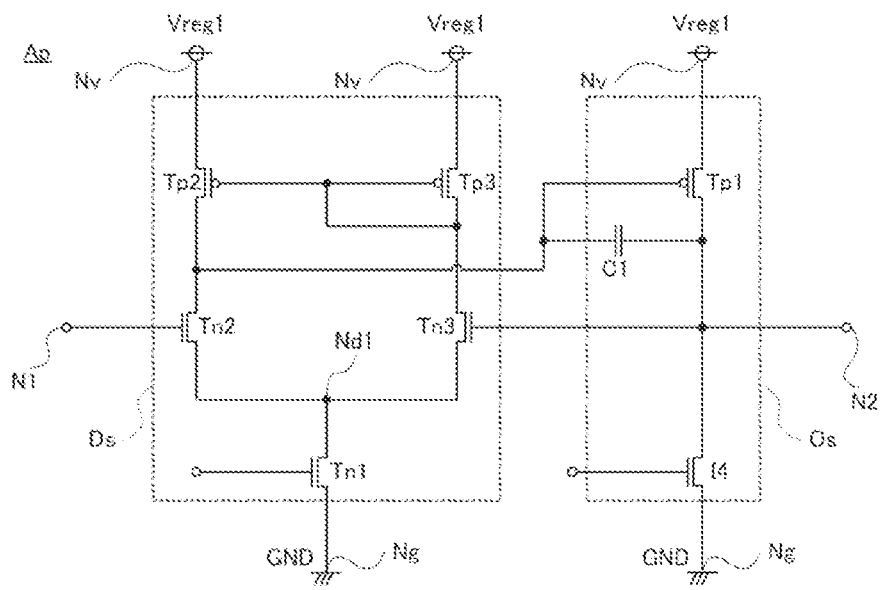
FIG. 12 is a diagram showing a push-type differential amplifier circuit.

FIG. 12 is a diagram showing a specific example of the push-type differential amplifier circuit Ap. The push-type differential amplifier circuit Ap is provided with the differential stage Ds and the output stage Os. In the present example, the output stage Os is provided with the PMOS transistor Tp1 described above coupled between the high potential power supply node Nv and the second node N2. Further, between the second node N2 and the low potential power supply node Ng, there is coupled an NMOS transistor functioning as the fourth current source I4. It should be noted that in the present example, between the gate and the drain of the PMOS transistor Tp1, there is coupled a capacitor C1.

The differential stage Ds is provided with a differential amplifier circuit constituted by PMOS transistors Tp2, Tp3, and NMOS transistors Tn1, Tn2, and Tn3. Specifically, the source of the PMOS transistor Tp2 is coupled to the high potential power supply node Nv, and the drain thereof is coupled to the drain of the NMOS transistor Tn2. The source of the NMOS transistor Tn2 is coupled to a node Nd1. In the NMOS transistor Tn1, the drain is coupled to the node Nd1, and the source is coupled to the low potential power supply node Ng.

Further, the source of the PMOS transistor Tp3 is coupled to the high potential power supply node Nv, and the drain thereof is coupled to the drain of the NMOS transistor Tn3. The source of the NMOS transistor Tn3 is coupled to the node Nd1. Further, the gates of the PMOS transistors Tp2, Tp3 are coupled to each other, and these gates are further coupled to the drain of the PMOS transistor Tp3. Further, the drain of the NMOS transistor Tn2 is coupled to the gate of the PMOS transistor Tp1, and the gate of the NMOS transistor Tn2 is coupled to the first node N1. Further, the gate of the NMOS transistor Tn3 is coupled to the second node N2.

Due to the configuration described above, the push-type differential amplifier circuit Ap functions as the voltage follower circuit provided with the PMOS transistor Tp1 controlled by the differential amplifier circuit and the fourth current source I4. For example, when the voltage at the first node N1 rises, the voltage of the drain of the NMOS transistor Tn2 falls. As a result, since the voltage acting on the gate of the PMOS transistor Tp1 falls, the current flowing through the PMOS transistor Tp1 increases, and thus, the voltage at the second node N2 rises. In such a manner, the push-type differential amplifier circuit Ap functions so as to make the voltages at the first node N1 and the second node N2 coincide with each other. Obviously, the configuration of the push-type differential amplifier circuit Ap shown in FIG. 12 is illustrative only, and it is possible to adopt a variety of types of configuration besides this.

(1-4) Modified Examples

Figure 13:
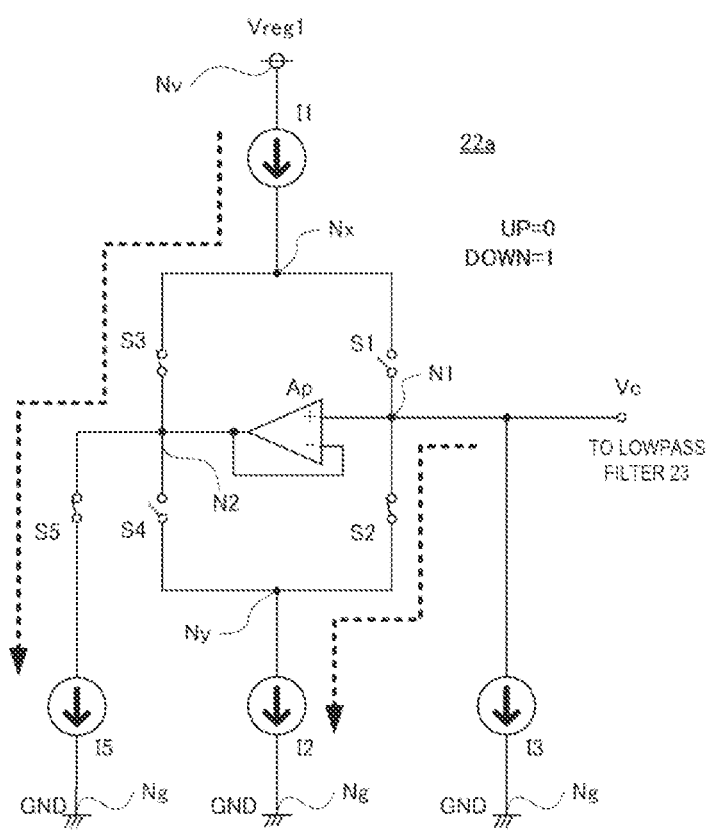
FIG. 13 is a diagram showing a charge pump circuit.

The embodiment described above is illustrative only, and it is possible to dispose a variety of additional circuits. FIG. 13 shows a circuit which allows the state of UP=0, DOWN=1 to occur in the charge pump circuit 22. Specifically, a charge pump circuit 22a shown in FIG. 13 has a configuration in which a fifth switch S5 and a fifth current source I5 are added to the charge pump circuit 22 shown in FIG. 8. Specifically, between the second node N2 and the low potential power supply node Ng, there are coupled the fifth switch S5 and the fifth current source I5 in series with each other.

The fifth switch S5 is set to the ON state or the OFF state at the same timing as in the second switch S2. In other words, the ON state and the OFF state are controlled so as to be complementary with the fourth switch S4. Therefore, as shown in FIG. 13, in the state of UP=0, DOWN=1, the fifth current source I5 is set to the ON state. In this state, since the third switch S3 is also set to the ON state, the current supplied from the first current source I1 passes through the fifth current source I5 via the fifth switch S5. The current supply capacity of the fifth current source I5 is the same as that of the first current source I1. Therefore, the current supplied from the first current source I1 does not flow toward the push-type differential amplifier circuit Ap from the second node N2, but flows toward the fifth current source I5.

Therefore, even when the state of UP=0, DOWN=1 occurs, the push-type differential amplifier circuit Ap can be realized with the same configuration as the configuration shown in FIG. 8. It should be noted that since the third current source I3 is also provided in the charge pump circuit 22a, it is possible to provide the phase of the clock signal FBCLK with the offset df. Therefore, it is hardly required to assume that the state of UP=0, DOWN=1 can occur, but the phase difference between the clock signal REFCLK and the clock signal FBCLK is significantly different in some cases in the initial period in which the operation of the fractional-N PLL circuit 20 is started.

When there is adopted the configuration in which the phase difference is large, and it is possible for the clock signal FBCLK to lag in phase behind the clock signal REFCLK as described above, the charge pump circuit 22a shown in FIG. 13 is preferable. According to this configuration, it is possible to lead the phase of the clock signal FBCLK using the state of UP=0, DOWN=1. Therefore, even when the clock signal FBCLK and the clock REFCLK are significantly shifted in phase from each other, it is possible to make the both coincide in phase with each other.

It should be noted that since the current does not flow through the fifth current source I5 unless the fifth switch S5 is set to the ON state, there is no chance for the continuous power consumption to increase by providing the fifth current source I5. Further, the fifth current source I5 is only required to be a constant current source, and can be formed of, for example, a current mirror circuit or a self-biased depletion MOS transistor.

Figure 14:
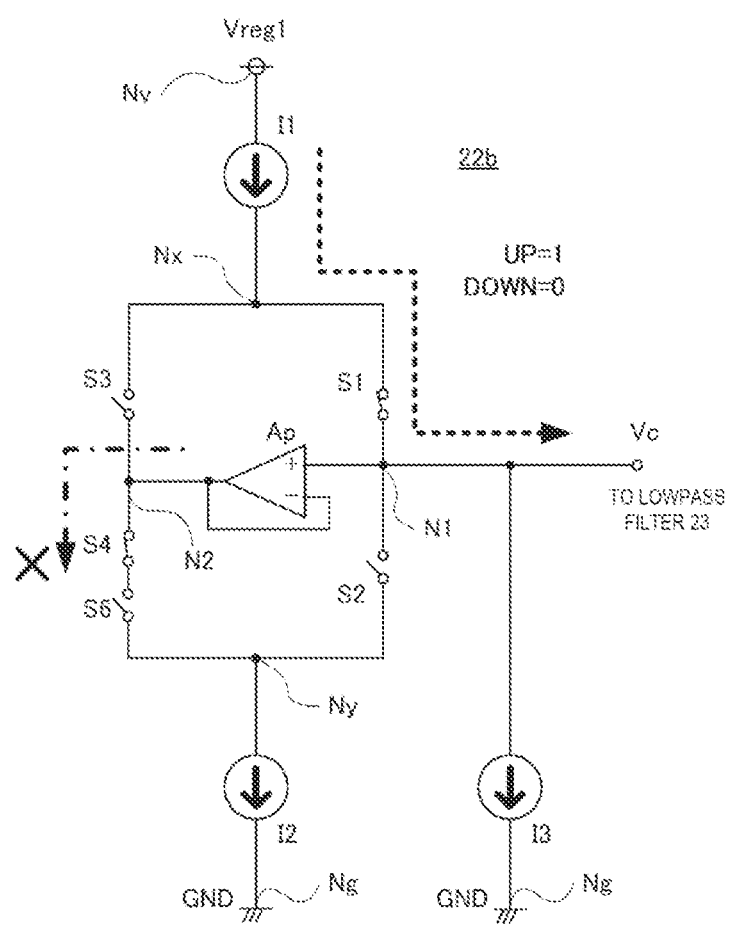
FIG. 14 is a diagram showing a charge pump circuit.

FIG. 14 shows a circuit provided with a configuration of suppressing the power consumption of the charge pump circuit 22. Specifically, a charge pump circuit 22b shown in FIG. 14 is a circuit obtained by adding a sixth switch S6 to the charge pump circuit shown in FIG. 8. Specifically, between the second current source I2 and the second node N2, the sixth switch S6 is coupled in series with the fourth switch S4. Further, the ON state and the OFF state of the sixth switch S6 are controlled so as to be complementary with the first switch S1.

Therefore, as shown in FIG. 14, the sixth switch S6 is set to the OFF state in the state of UP=1, DOWN=0, and in this state, the current represented by the dashed-dotted line does not flow. In FIG. 14, the fact that the current does not flow is represented by the symbol X. According to the configuration described above, in the state of UP=1, DOWN=0, the push-type differential amplifier circuit Ap is not required to supply the current to the second node N2 as indicated by the dotted line shown in FIG. 10. Therefore, it is possible to suppress the power consumed by the push-type differential amplifier circuit Ap in the state of UP=1, DOWN=0.

(2) Second Embodiment

In the charge pump circuit 22 according to the present embodiment described above, there is adopted the configuration in which one of the three states described above, namely the state of UP=0, DOWN=1, does not occur, but it is possible to adopt a configuration in which the state of UP=1, DOWN=0 does not occur.

Figure 15:
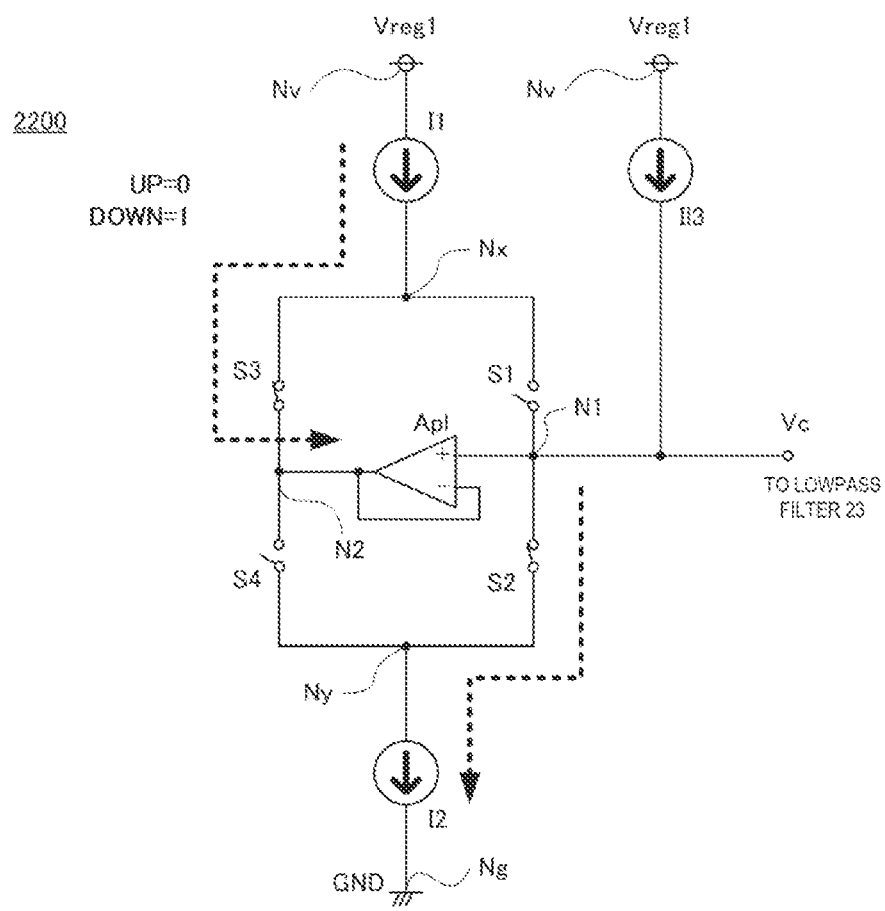
FIG. 15 is a diagram showing a charge pump circuit.

Specifically, such a configuration can be realized by replacing the operational amplifier circuit A1 in the related-art charge pump circuit 220 with a pull-type differential amplifier circuit Apl, and further coupling a third current source Il3 between the first node N1 and the high potential power supply node Nv. FIG. 15 is a diagram showing a configuration of the charge pump circuit 2200 according to the present embodiment. Hereinafter, constituents the same as those in the charge pump circuits 22, 220 are shown with the same reference symbols attached.

Figure 16:
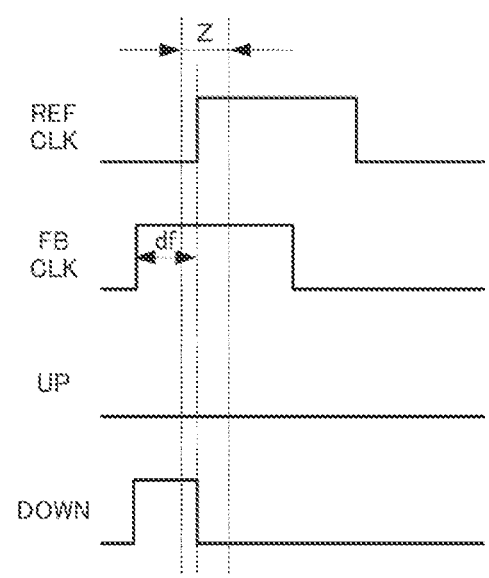
FIG. 16 is a diagram showing a timing chart of signals related to the charge pump circuit.

The third current source Il3 is a current source of supplying a positive offset current to the first node N1. In other words, the third current source Il3 functions as a current source of supplying a continuous current to the first node N1. FIG. 16 is a diagram for explaining a relationship between the clock signal REFCLK, the clock signal FBCLK, the UP signal, and the DOWN signal when using the charge pump circuit 2200. In the present embodiment, due to the current supplied by the third current source Il3 to the first node N1, the phase of the clock signal FBCLK is always provided with a certain offset df toward a direction (the leftward direction in the drawing) of leading an amount of the phase.

In the present embodiment, due to the offset df, the DOWN signal is output in the period corresponding to the offset df in the state in which the fractional-N PLL circuit 20 locks, and the state of UP=0, DOWN=1 is created. Further, in the present embodiment, since the phase of the clock signal FBCLK is provided with the offset so as to lead the clock signal REFCLK in phase, the state of UP=1 does not occur (or hardly occurs). Therefore, in the pull-type differential amplifier circuit Apl according to the present embodiment, it becomes unnecessary to assume the operation in the state of UP=1, DOWN=0.

Therefore, in the charge pump circuit 2200 according to the present embodiment, there is no need to supply a current from the pull-type differential amplifier circuit Apl to the second node N2. Therefore, the pull-type differential amplifier circuit Apl is used as the voltage follower circuit provided to the charge pump circuit 2200.

Figure 17:
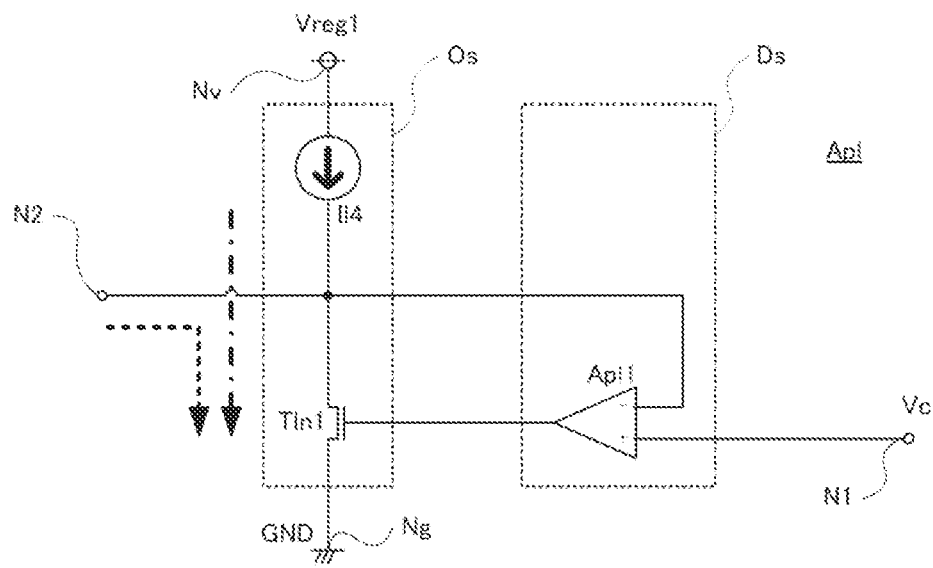
FIG. 17 is a diagram showing a pull-type differential amplifier circuit.

FIG. 17 is a diagram showing a configuration example of the pull-type differential amplifier circuit Apl. The pull-type differential amplifier circuit Apl shown in FIG. 17 includes the output stage Os and the differential stage Ds. The output stage Os is provided with an NMOS transistor Tln1 and a fourth current source Il4. The NMOS transistor Tln1 is disposed between the low potential power supply node Ng and the second node N2, the source of the NMOS transistor Tln1 is coupled to the low potential power supply node Ng, and the drain thereof is coupled to the second node N2. The fourth current source Il4 is disposed between the second node N2 and the high potential power supply node Nv.

The differential stage Ds is provided with an operational amplifier Apl1, a non-inverting input terminal is coupled to the first node N1 (an output node Vc of the charge pump circuit 2200), and the gate of the NMOS transistor Tln1 is coupled to an output terminal. An inverting input terminal of the operational amplifier Apl1 is coupled to the second node N2.

In the charge pump circuit 2200 in which such a pull-type differential amplifier circuit Apl is used, when the state of UP=0, DOWN=1 is realized, it is necessary for the current to be drawn from the second node N2 toward the pull-type differential amplifier circuit Apl as indicated by the dotted line shown in FIG. 17. This current is drawn toward the low potential power supply node Ng by the NMOS transistor Tln1 operating in accordance with the control by the operational amplifier Apl1. In contrast, in the charge pump circuit 2200, there is adopted the configuration in which the state of UP=1, DOWN=0 is not realized. Therefore, it is unnecessary to output such a high current as the current by the second current source I2 to the second node N2 from the pull-type differential amplifier circuit Apl.

Further, in the charge pump circuit 2200, when the state of UP=0, DOWN=0 is realized, there is no need to supply the current from the second node N2 to the pull-type differential amplifier circuit Apl, and there is no need to draw the current from the second node N2. Therefore, in this state, it is sufficient for the current to flow from the high potential power supply node Nv to the low potential power supply node Ng via the fourth current source Il4 and the NMOS transistor Tln1 as indicated by the dashed-dotted line in the pull-type differential amplifier circuit Apl. The current value of this current is the value of the current flowing due to the fourth current source Il4 as a constant current source, but the fourth current source Il4 is not required to draw the current from the first current source I1, and is not required to supply the current to the second current source I2.

Therefore, the current supply capacity of the fourth current source Il4 does not depend on the first current source I1 and the second current source I2. Therefore, it is sufficient for the fourth current source Il4 to have the current supply capacity enough to supply a current sufficient to operate the pull-type differential amplifier circuit Apl. For example, by making the current supply capacity of the fourth current source Il4 lower than those of the first current source I1 and the second current source I2, it is possible to reduce the power consumption to be lower than that of the related-art charge pump circuit 220.

Further, since the current supply capacity of the fourth current source Il4 does not depend on the first current source I1 and the second current source I2, the degree of freedom in making the design corresponding to the frequency of the clock signal REFCLK in the fractional-N PLL circuit 20 also increases. Further, according to the charge pump circuit 2200 related to the present embodiment, since it is possible to change the current supply capacity of the fourth current source Il4, it is easy to make the design corresponding to when the frequency of the clock signal REFCLK is high.

Further, also in the present embodiment, since the third current source Il3 provides the phase of the clock signal FBCLK with the offset df, it is possible to prevent the deterioration in phase setting accuracy due to the dead zone of the phase comparator. Also in the present embodiment, each of the first current source I1, the second current source I2, the third current source Il3, and the fourth current source Il4 is a constant current source, and can be formed of a variety of types of circuit such as a current mirror circuit, or a self-biased depletion MOS transistor. Further, the pull-type differential amplifier circuit Apl can also be realized by a variety of types of configuration.

Figure 18:
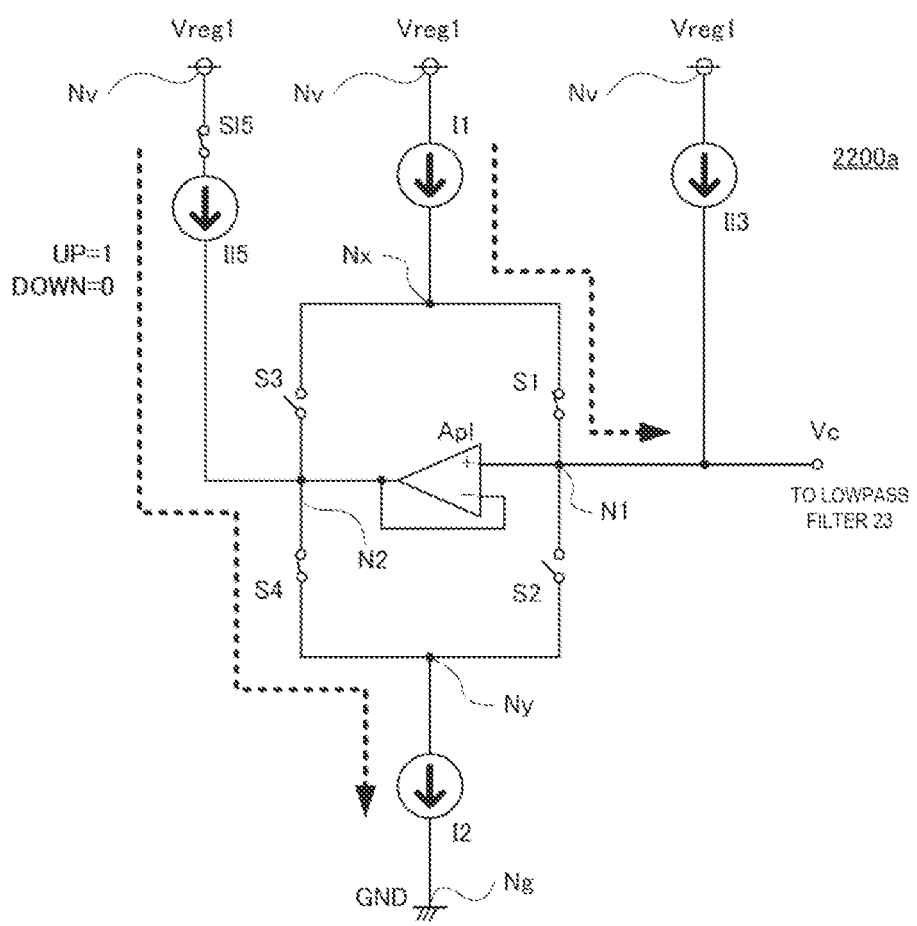
FIG. 18 is a diagram showing a charge pump circuit.

Also in the present embodiment, a variety of additional circuits can be provided. FIG. 18 shows a circuit which allows the state of UP=1, DOWN=0 to occur in the charge pump circuit 2200. Specifically, a charge pump circuit 2200a shown in FIG. 18 has a configuration in which a fifth switch S15 and a fifth current source Il5 are added to the charge pump circuit 2200 shown in FIG. 15. Specifically, between the second node N2 and the high potential power supply node Nv, there are coupled the fifth switch S15 and the fifth current source Il5 in series with each other.

The fifth switch S15 is set to the ON state or the OFF state at the same timing as in the first switch S1. In other words, the ON state and the OFF state are controlled so as to be complementary with the third switch S3. Therefore, as shown in FIG. 18, in the state of UP=1, DOWN=0, the fifth current source Il5 is set to the ON state. In this state, since the fourth switch S4 is also set to the ON state, the current supplied from the fifth current source Il5 passes through the second current source I2. The current supply capacity of the fifth current source Il5 is the same as that of the second current source I2. Therefore, the current supplied from the fifth current source Il5 does not flow toward the pull-type differential amplifier circuit Apl from the second node N2, but flows toward the second current source I2.

Therefore, even when the state of UP=1, DOWN=0 occurs, the pull-type differential amplifier circuit Apl can be realized with the same configuration as the configuration shown in FIG. 15. Even when the clock signal FBCLK lags in phase behind the clock signal REFCLK, and the state of UP=1, DOWN=0 occurs, it is possible to make the both coincide with each other.

Figure 19:
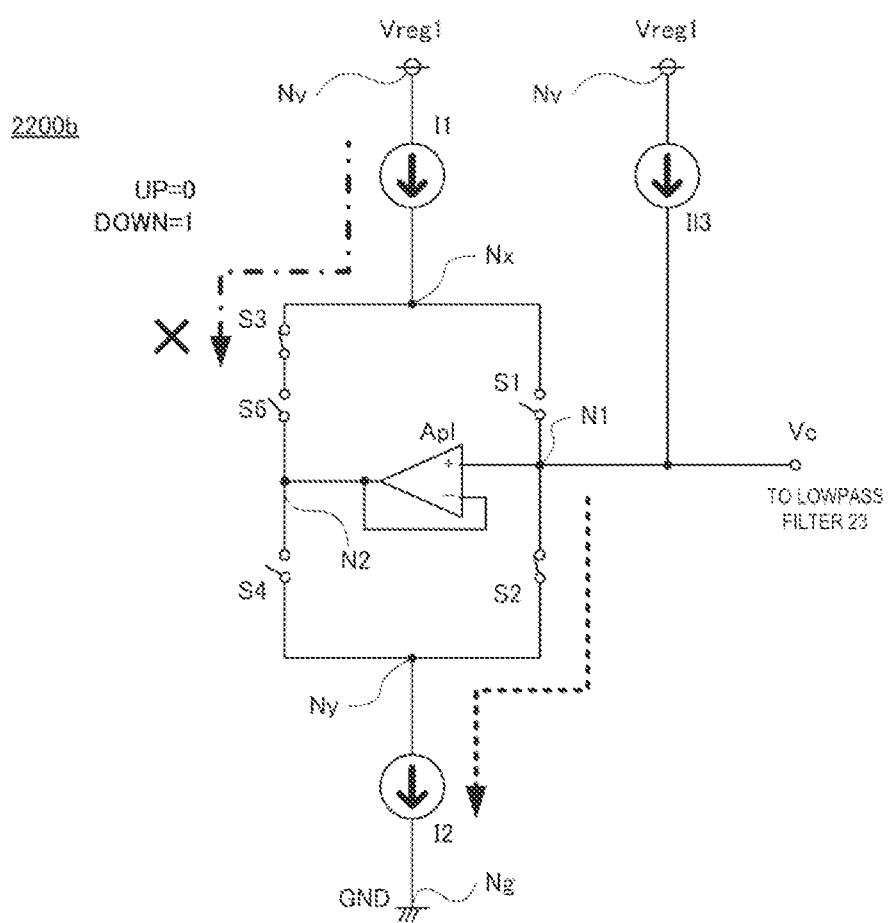
FIG. 19 is a diagram showing a charge pump circuit.

FIG. 19 shows a circuit provided with a configuration of suppressing the power consumption of the charge pump circuit 2200. Specifically, a charge pump circuit 2200b shown in FIG. 19 is a circuit obtained by adding a sixth switch S16 to the charge pump circuit shown in FIG. 15. Specifically, between the first current source I1 and the second node N2, the sixth switch S16 is coupled in series with the third switch S3. Further, the ON state and the OFF state of the sixth switch S16 are controlled so as to be complementary with the second switch S2.

Therefore, as shown in FIG. 19, the sixth switch S16 is set to the OFF state in the state of UP=0, DOWN=1, and in this state, the current represented by the dashed-dotted line does not flow. In FIG. 19, the fact that the current does not flow is represented by the symbol x. According to the configuration described above, in the state of UP=0, DOWN=1, the pull-type differential amplifier circuit Apl is not required to supply the current to the second node N2 as indicated by the dotted line shown in FIG. 17. Therefore, it is possible to suppress the power consumed by the pull-type differential amplifier circuit Apl in the state of UP=0, DOWN=1.

(3) Other Embodiments

The embodiment described above is an example for implementing the present disclosure, a variety of types of embodiment can be adopted besides the above. For example, the PLL circuit can be a PLL circuit which is not provided with the delta sigma modulation circuit 120, namely a PLL circuit which obtains an integral multiple of the clock signal PLLCLK instead of the fractional-N PLL circuit. The application object of the PLL circuit related to the embodiment of the present disclosure is not limited, but the PLL circuit related to the embodiment can be used for a variety of objects such as a variety of electronic apparatuses, electric components of a vehicle.

It is sufficient for the charge pump circuit to be a circuit for outputting a phase difference current to the first node. In other words, it is sufficient for the charge pump circuit to be a circuit which performs at least one of the drawing of the current from the first node and the supply of the current to the first node in accordance with the comparison result by the phase comparator. The operation of the charge pump circuit corresponding to the phase difference current can be a variety of types of operation. In other words, it is sufficient for the operation of the charge pump circuit to be able to output the phase difference current for approximating the phase of the feedback signal to the phase of a reference signal to the first node.

It is sufficient for the phase difference current to be a current which is supplied to the voltage-controlled oscillation circuit via the lowpass filter, and approximates the phase of the feedback signal and the phase of the reference signal to each other when the both are different from each other. Therefore, the output of the phase difference current to the first node includes at least one of the state in which the current is supplied to the first node and the state in which the current is drawn from the first node.

It is sufficient for the first current source to be coupled between the high potential power supply node and the first node, and at the same time, to be coupled between the high potential power supply node and the second node. In other words, the first current source is capable of supplying a predetermined current to the first node or the second node. The high potential power supply node is a node higher in potential compared to the low potential power supply node, and is, for example, a positive side power supply. It is sufficient for the first current source to be able to receive the power supply from the high potential power supply node, and then supply the current to the first node or the second node.

It is sufficient for the second current source to be coupled between the low potential power supply node and the first node, and at the same time, to be coupled between the low potential power supply node and the second node. In other words, the second current source is capable of drawing the current from the first node or the second node. The low potential power supply node is a node lower in potential compared to the high potential power supply node, and is, for example, the ground or a negative side power supply. It should be noted that it is preferable for the current flowing due to the second current source and the current flowing due to the first current source to be the same as each other, and it is preferable for the both current sources to be the same in current supply capacity as each other.

It is sufficient for the first through fourth switches and the fifth and sixth switches to be able to switch between the state in which the current flows between the two terminals and the state in which the current does not flow, and to operate in accordance with the comparison result of the phase comparator. It is sufficient for the switches to be able to switch between the states based on the signal from the phase comparator, and to this extent, the number of the switches is arbitrary. Further, as the configuration for switching between the states in accordance with the signal, there can be adopted a variety of types of configuration, and it is possible to adopt a transistor such as a MOS transistor or a bipolar transistor, and it is possible to use a variety of types of switches besides the above.

It is sufficient for the signal from the phase comparator to represent the comparison result in the phase comparator. Therefore, the signal can be one or both of the UP signal representing the fact that the phase of the clock signal REFCLK to the phase comparator leads the phase of the clock signal FBCLK as the feedback signal, and the DOWN signal representing the fact that the phase of the clock signal REFCLK lags behind the phase of the clock signal FBCLK.

It is sufficient for the third current source to supply a negative offset current or a positive offset current to the first node. In other words, it is sufficient for the third current source to always draw a current from the first node, or to always supply a current to the first node. It is sufficient for the offset current to be able to provide an offset to the phase of the feedback signal by being always drawn therefrom or being always supplied thereto. In other words, it is sufficient to be provided with a configuration in which the PLL circuit locks with the phase difference which is not affected by the dead zone of the PLL circuit by providing a configuration in which the PLL circuit locks in the state in which the phase difference provided with the offset is generated. It should be noted that in the third current source, it is sufficient to provide an offset to the phase of the feedback signal. Therefore, the current flowing due to the third current source can be smaller than those of the first current source and the second current source, and the current supply capacity of the third current source can be lower than those of the first current source and the second current source.

In the push-type differential amplifier circuit and the pull-type differential amplifier circuit, it is sufficient for the input side to be coupled to the first node, and it is sufficient for the output side to be coupled to the second node. In other words, it is sufficient for the push-type differential amplifier circuit and the pull-type differential amplifier circuit to function as a voltage follower for making the input side and the output side of the differential amplifier circuit the same in potential.

It should be noted that either one of the push-type and the pull-type is selected in accordance with which one of the negative offset current and the positive offset current the current due to the third current source is. In other words, it is possible to adopt the configuration in which the DOWN signal is not output (or is hardly output) when the negative offset current provides the phase of the feedback signal with the offset so as to always lag. Therefore, it is sufficient to adopt the push-type differential amplifier circuit so that the current is output from the differential amplifier circuit coupled to the second node.

In contrast, it is possible to adopt the configuration in which the UP signal is not output (or is hardly output) when the positive offset current provides the phase of the feedback signal with the offset so as to always lead. Therefore, it is sufficient to adopt the pull-type differential amplifier circuit so that the differential amplifier circuit draws the current from the second node.

What is claimed is:

1. A charge pump circuit configured to output a phase difference current to a first node, comprising:
   a first current source coupled between a high potential power supply node and the first node;
   a second current source coupled between a low potential power supply node and the first node;
   a first switch coupled between the first current source and the first node;
   a second switch coupled between the second current source and the first node;
   a third switch coupled between the first current source and a second node;
   a fourth switch coupled between the second current source and the second node;

a third current source configured to supply a negative offset current to the first node; and a push-type differential amplifier circuit an input side of which is coupled to the first node, and an output side of which is coupled to the second node.

2. The charge pump circuit according to claim 1, wherein the push-type differential amplifier circuit includes a differential stage and an output stage, and the output stage includes a PMOS transistor which is disposed between the high potential power supply node and the second node, and which is driven by an output voltage of the differential stage, and a fourth current source disposed between the second node and the low potential power supply node.

3. The charge pump circuit according to claim 2, wherein the fourth current source is lower in current supply capacity than the first current source and the second current source.

4. The charge pump circuit according to claim 1, further comprising:

a fifth switch and a fifth current source coupled in series with each other between the second node and the low potential power supply node, wherein an ON state and an OFF state of the fifth switch are controlled so as to be complementary with the fourth switch.

5. The charge pump circuit according to claim 1, further comprising:

a sixth switch coupled in series with the fourth switch between the second current source and the second node, wherein an ON state and an OFF state of the sixth switch are controlled so as to be complementary with the first switch.

6. A charge pump circuit configured to output a phase difference current to a first node, comprising:

a first current source coupled between a high potential power supply node and the first node;

a second current source coupled between a low potential power supply node and the first node;

a first switch coupled between the first current source and the first node;

a second switch coupled between the second current source and the first node;

a third switch coupled between the first current source and a second node;

a fourth switch coupled between the second current source and the second node;

a third current source configured to supply a positive offset current to the first node; and a pull-type differential amplifier circuit an input side of which is coupled to the first node, and an output side of which is coupled to the second node.

7. The charge pump circuit according to claim 6, wherein the pull-type differential amplifier circuit includes a differential stage and an output stage, and the output stage includes an NMOS transistor which is disposed between the low potential power supply node and the second node, and which is driven by an output voltage of the differential stage, and a fourth current source disposed between the second node and the high potential power supply node.

8. The charge pump circuit according to claim 7, wherein the fourth current source is lower in current supply capacity than the first current source and the second current source.

9. The charge pump circuit according to claim 6, further comprising:

a fifth switch and a fifth current source coupled in series with each other between the second node and the high potential power supply node, wherein an ON state and an OFF state of the fifth switch are controlled so as to be complementary with the third switch.

10. The charge pump circuit according to claim 6, further comprising:

a sixth switch coupled in series with the third switch between the first current source and the second node, wherein an ON state and an OFF state of the sixth switch are controlled so as to be complementary with the second switch.

11. A PLL circuit comprising:

a phase comparator configured to compare a phase of a reference signal and a phase of a feedback signal with each other to output one of a phase-lag control signal and a phase-lead control signal as a phase difference signal;

the charge pump circuit according to claim 1 configured to convert the phase difference signal into a phase difference current;

a lowpass filter configured to convert the phase difference current output by the charge pump circuit into a smoothed voltage;

a voltage-controlled oscillation circuit configured to output an output signal which changes in frequency in accordance with a control voltage taking the voltage output by the lowpass filter as the control voltage; and a divider circuit which is disposed on a signal path reaching an input of the phase comparator from an output of the voltage-controlled oscillation circuit, and which is configured to output the feedback signal.

12. An oscillator comprising:

the PLL circuit according to claim 11; and an oscillation circuit configured to oscillate a resonator to supply the PLL circuit with the reference signal.

* * * * *